United States Patent
Ashizawa

(10) Patent No.: US 11,848,627 B2
(45) Date of Patent: Dec. 19, 2023

(54) MEMS BEAM STRUCTURE AND MEMS VIBRATION-DRIVEN ENERGY HARVESTING ELEMENT

(71) Applicant: Saginomiya Seisakusho, Inc., Tokyo (JP)

(72) Inventor: Hisayuki Ashizawa, Sayama (JP)

(73) Assignee: SAGINOMIYA SEISAKUSHO, INC., Tokyo (JP)

( * ) Notice: Subject to any disclaimer, the term of this patent is extended or adjusted under 35 U.S.C. 154(b) by 204 days.

(21) Appl. No.: 17/423,051

(22) PCT Filed: Jan. 14, 2020

(86) PCT No.: PCT/JP2020/000916
§ 371 (c)(1),
(2) Date: Jul. 14, 2021

(87) PCT Pub. No.: WO2020/149265
PCT Pub. Date: Jul. 23, 2020

(65) Prior Publication Data
US 2022/0131478 A1    Apr. 28, 2022

(30) Foreign Application Priority Data
Jan. 16, 2019 (JP) ................................. 2019-005388

(51) Int. Cl.
*B81B 7/00* (2006.01)
*B81B 3/00* (2006.01)
*H02N 1/08* (2006.01)

(52) U.S. Cl.
CPC .......... *H02N 1/08* (2013.01); *B81B 2203/019* (2013.01)

(58) Field of Classification Search
CPC . H02N 1/08; H02N 1/00; H02N 1/008; B81B 2003/0163; B81B 2203/1045;
(Continued)

(56) References Cited

U.S. PATENT DOCUMENTS 6,329,738 B1 * 12/2001 Hung .................... B81B 3/0037
310/309
6,546,801 B2 * 4/2003 Orsier ................... B81B 3/0051
73/514.29
(Continued)

FOREIGN PATENT DOCUMENTS

JP     2007139505 A     6/2007
JP     2008292426 A    12/2008
(Continued)

OTHER PUBLICATIONS

Office Action dated May 16, 2023 in CN application 202080009006.9 (with machine translation).

*Primary Examiner* — Burton S Mullins
(74) *Attorney, Agent, or Firm* — Workman Nydegger

(57) ABSTRACT

This MEMS beam structure that elastically supports a movable section displaced in a first direction includes: a first beam section and a second beam section extending in a second direction orthogonal to the first direction; and a linking section that connects the tip of the first beam section and the tip of the second beam section that is connected to the movable section, wherein the first beam section and the second beam section each have a shape as a beam of uniform strength, and the beam section root of the second beam section is displaced relatively in the first direction with respect to the beam section root of the first beam section according to the displacement of the movable section in the first direction.

9 Claims, 13 Drawing Sheets

(58) Field of Classification Search
CPC .... B81B 2203/0154; B81B 2203/0307; B81B 3/0051; B81B 2203/051; B81B 2203/019; B81B 2203/109; H03H 2009/02291; H03H 2009/02307
USPC .......................................................... 310/308
See application file for complete search history.

(56) References Cited

U.S. PATENT DOCUMENTS

| | | | | |
|---|---|---|---|---|
| 6,710,680 | B2* | 3/2004 | Niu | B81B 3/007 |
| | | | | 333/197 |
| 6,876,283 | B1* | 4/2005 | Weber | H01H 59/0009 |
| | | | | 335/78 |
| 7,331,230 | B2* | 2/2008 | Takeyari | G01P 15/18 |
| | | | | 73/514.33 |
| 7,932,788 | B2* | 4/2011 | Schenk | B81B 3/0078 |
| | | | | 250/214 R |
| 7,954,215 | B2* | 6/2011 | Saito | G01P 15/0802 |
| | | | | 29/25.35 |
| 8,390,399 | B2* | 3/2013 | Huang | H03H 9/02338 |
| | | | | 333/186 |
| 8,940,570 | B2* | 1/2015 | Jahnes | B81B 3/001 |
| | | | | 438/50 |
| 9,484,522 | B2* | 11/2016 | Andosca | H10N 30/306 |
| 9,588,337 | B2* | 3/2017 | Van Lierop | G02B 26/0833 |
| 10,322,481 | B2* | 6/2019 | Dehe | B81C 1/00158 |
| 10,322,925 | B2* | 6/2019 | Liu | B81B 7/0016 |
| 10,340,818 | B2* | 7/2019 | Suzuki | F16K 31/02 |
| 11,296,671 | B2* | 4/2022 | Liukku | H03H 9/2405 |
| 11,374,507 | B2* | 6/2022 | Toshiyoshi | H02N 1/08 |
| 11,459,229 | B2* | 10/2022 | Duerr | G02B 26/0833 |
| 2006/0065054 | A1* | 3/2006 | Ikeda | G01P 15/0802 |
| | | | | 73/514.33 |
| 2009/0250853 | A1* | 10/2009 | Wolter | B81B 3/0078 |
| | | | | 267/154 |
| 2017/0052027 | A1* | 2/2017 | Jomori | H10N 30/302 |
| 2021/0119556 | A1 | 4/2021 | Toshiyoshi et al. | |

FOREIGN PATENT DOCUMENTS

| | | | | |
|---|---|---|---|---|
| JP | 2011047821 | * | 3/2011 | ............ G01P 15/18 |
| JP | 2012237673 | * | 12/2012 | ........... G01P 15/135 |
| JP | 2018088780 | A | 6/2018 | |
| JP | 2018132493 | * | 8/2018 | ........... G01P 15/125 |
| WO | WO2018101046 | * | 7/2018 | ............... H02N 1/00 |

* cited by examiner

MEMS BEAM STRUCTURE AND MEMS VIBRATION-DRIVEN ENERGY HARVESTING ELEMENT

TECHNICAL FIELD

The present invention relates to a MEMS beam structure and a MEMS vibration-driven energy harvesting element.

BACKGROUND ART

Conventionally, there is known a vibration-driven energy harvesting element formed by processing a silicon substrate by a micro electro-mechanical system (MEMS) processing technique (see PTL 1). In the vibration-driven energy harvesting element disclosed in PTL 1, a movable electrode on which comb teeth are formed is supported by an elastic support section of a rectangular beam structure with respect to a fixed electrode on which comb teeth are formed. When an external impact is applied to the vibration-driven energy harvesting element, the elastically supported movable electrode vibrates with respect to the fixed electrode, with the result that power generation is performed.

CITATION LIST

Patent Literature

PTL 1: Japanese Patent Laid-Open No. 2018-88780

SUMMARY OF INVENTION

Technical Problem

Incidentally, since the amount of power generation depends on the size of an electrode region, it is necessary to make the region of the elastic support section as small as possible to expand the electrode region in order to improve the amount of power generation with the same element area. It is also essential to reduce the size of the elastic support section in reducing the size of the vibration-driven energy harvesting element.

Solution to Problem

According to a first aspect of the present invention, a MEMS beam structure that elastically supports a movable section displaced in a first direction includes a first beam section and a second beam section extending in a second direction orthogonal to the first direction, and a linking section that connects a tip of the first beam section and a tip of the second beam section that is connected to the movable section, wherein the first beam section and the second beam section each have a shape as a beam of uniform strength, and a beam section root of the second beam section is displaced relatively in the first direction with respect to a beam section root of the first beam section according to a displacement of the movable section in the first direction.

According to a second aspect of the present invention, in the MEMS beam structure according to the first aspect, it is preferable that a width dimension X1 of the first beam section in the first direction be set so that $X1=\sqrt{(W1^2-Y1/A1)}$ in a case where a beam section root dimension is W1, a distance from the beam section root is Y1, and A1 is a positive coefficient and that a width dimension X2 of the second beam section in the first direction is set so that $X2=\sqrt{(W2^2-Y2/A2)}$ in a case where a beam section root dimension is W2, a distance from the beam section root is Y2, and A2 is a positive coefficient.

According to a third aspect of the present invention, in the MEMS beam structure according to the second aspect, it is preferable that the beam section root dimensions W1 and W2 be set to be equal, the coefficients A1 and A2 be set to be equal, and the first and second beam sections be set such that a value of the expression "$\sqrt{(W2^2-Y2/A2)}$" becomes zero at an intermediate position between the beam section root of the first beam section and the beam section root of the second beam section.

According to a fourth aspect of the present invention, in the MEMS beam structure according to the third aspect, it is preferable that a width dimension of the linking section in the first direction be set so as to be equal to the width dimensions of the first and second beam sections in the first direction at connecting portions between the linking section and the first and second beam sections.

According to a fifth aspect of the present invention, in the MEMS beam structure according to any one of the first to fourth aspects, it is preferable that a connecting section that connects the MEMS beam structure to a connection target be provided at each beam section root of the first and second beam sections and that elliptical chamfers be continuous with side surfaces of the beam section roots in the first direction be formed at side surfaces of the connecting sections in the first direction.

According to a sixth aspect of the present invention, in a MEMS vibration-driven energy harvesting element including a fixed electrode, a movable electrode, and a support section that elastically supports the movable electrode, the support section has the MEMS beam structure according to the first to fifth aspects.

Advantageous Effects of Invention

According to the present invention, the size of the elastic support section can be reduced without reducing the amount of power generation.

DESCRIPTION OF EMBODIMENTS

Embodiments of the present invention will be hereinafter described with reference to the drawings.

First Embodiment

Figure 1:
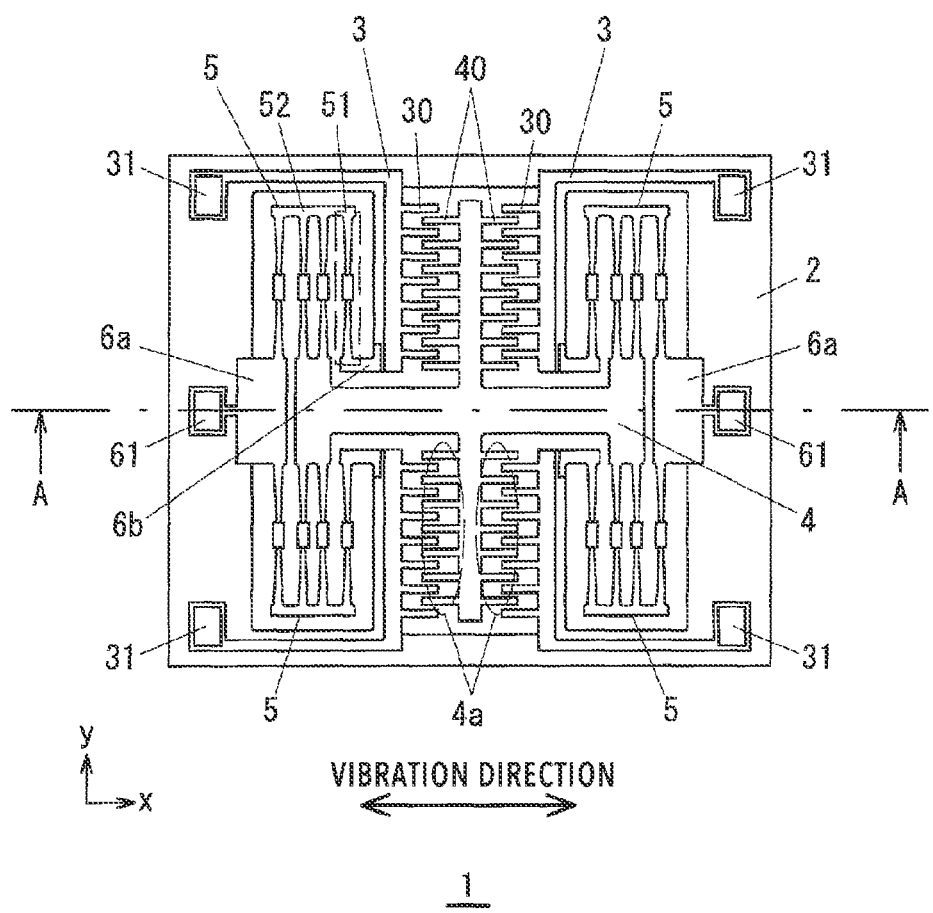
FIG. 1 is a plan view of a vibration-driven energy harvesting element.

FIG. 1 is a plan view of a vibration-driven energy harvesting element 1 using a MEMS beam structure of the present embodiment. The material of the vibration-driven energy harvesting element 1 is Si and the vibration-driven energy harvesting element 1 is formed by a general MEMS processing technique using, for example, a Silicon On Insulator (SOI) substrate. The vibration-driven energy harvesting element 1 shown in FIG. 1 is a minute power generation element having one side of about 10 to several 10 mm and is used for the purpose of generating power by the mechanical vibration (environmental vibration) of a compressor operating in a factory or the like to supply a monitoring sensor or a wireless terminal with electric power. The SOI substrate is a substrate having a three-layer structure consisting of a Si handle layer, a $SiO_2$ BOX layer, and a Si device layer. The vibration-driven energy harvesting element 1 is not limited to being formed from the SOI substrate, and may be formed by using a Si substrate or the like.

Vibration-Driven Energy Harvesting Element 1

The vibration-driven energy harvesting element 1 includes a base 2, four sets of fixed electrodes 3 fixed on the base 2, a movable electrode 4 provided corresponding to the fixed electrodes 3, and elastic support sections 5 that elastically support the movable electrode 4. In FIG. 1, the handle layer of the SOI substrate is provided on the back side in the figure and the base 2 is formed on the handle layer. The four sets of fixed electrodes 3, the movable electrode 4, and the four sets of elastic support sections 5 are formed on the device layer which is on the front side in the figure. The movable electrode 4 is connected to fixed sections 6a provided on the base 2 via the elastic support sections 5. An electrode pad 31 is provided on each fixed electrode 3, and an electrode pad 61 is also provided on each fixed section 6a.

Fixed Electrodes 3, Movable Electrode 4

As shown in FIG. 1, each of the four sets of fixed electrodes 3 has a line of comb tooth in which a plurality of fixed comb teeth 30 extending in an x direction are arranged in a y direction. The movable electrode 4 has four sets of movable comb teeth groups 4a corresponding to the four sets of fixed electrodes 3. Each movable comb teeth group 4a includes a line of comb teeth in which a plurality of movable comb teeth 40 extending in the x direction are arranged in the y direction. The plurality of fixed comb teeth 30 formed on the fixed electrodes 3 and the plurality of movable comb teeth 40 of the movable comb teeth groups 4a corresponding to the fixed electrodes 3 are arranged such that in a stationary state (neutral state), they engage with each other having a predetermined length of engagement in the x direction through gaps.

Elastic Support Sections 5

As shown in FIG. 1, the four sets of elastic support sections 5 are provided, and the right end portion of the movable electrode 4 shown in the figure is supported by two sets of the elastic support sections 5 on the right side and the left end portion of the movable electrode 4 shown in the figure is supported by two sets of the elastic support sections 5 on the left side. Each elastic support section 5 includes four sets of MEMS beam structures 51. The upper end sides or the lower end sides shown in the figure of the four sets of MEMS beam structures 51 provided on the elastic support sections 5 are connected to coupling sections 52.

For example, in the four sets of MEMS beam structures 51 arranged on the upper left of the figure, the lower end sides of two sets of MEMS beam structures 51 arranged inside are connected to the movable electrode 4, and the upper end sides of the two sets of MEMS beam structures 51 are connected to one of the coupling sections 52. The lower end side of the MEMS beam structure 51 arranged at the left end in the figure is connected to the fixed section 6a provided on the base 2, and the lower end side of the MEMS beam structure 51 arranged at the right end in the figure is connected to a fixed section 6b provided on the base 2. That is, the movable electrode 4 is displaced in the x direction with respect to the coupling section 52 connected by the two sets of MEMS beam structures 51 arranged inside, and the coupling section 52 is displaced in the x direction with respect to the base 2 connected by the two sets of MEMS beam structures 51 arranged at both right and left ends. The other MEMS beam structures 51 also have a similar connection structure. The detailed structure of the MEMS beam structure 51 will be described later.

An electret is formed on at least one of the fixed comb teeth 30 and the movable comb teeth 40, and the length of engagement between the fixed comb teeth 30 and the movable comb teeth 40 is changed by vibration of the movable electrode 4 to generate power. The electret may be provided on each of the fixed comb teeth 30 and the movable comb teeth 40. The movable electrode 4 and the base 2 are connected to each other by the elastic support sections 5 that function as springs to constitute a spring-mass resonance system. When an external impact is applied to the vibration-driven energy harvesting element 1, the MEMS beam structures 51 of the elastic support section 5 are deformed by resonance (in the case of sinusoidal vibration) or transient response (in the case of impulse vibration), and the movable electrode 4 vibrates in the x direction shown in FIG. 1. In a case where the movable comb teeth 40 vibrate with respect to the fixed comb teeth 30, an induced current is generated and this current can be used as a power generation element by taking it out from the electrode pads 31 and 61.

Since the amount of power generation depends on the size of an electrode region, it is necessary to make the region of the elastic support section 5 as small as possible to expand the electrode region in order to improve the amount of power generation with the same element area. It is also essential to reduce the size of the elastic support section 5 in reducing the size of the vibration-driven energy harvesting element 1. However, as described above, since the movable electrode 4 and the elastic support sections 5 constitute the spring-mass resonance system, the configuration of the elastic support section 5 affects vibration characteristics. In the present embodiment, the MEMS beam structure 51 has an unprecedented configuration, which makes it possible to reduce the size of the elastic support section 5 while suppressing an influence on the vibration characteristics.

MEMS Beam Structure 51

Figure 2:
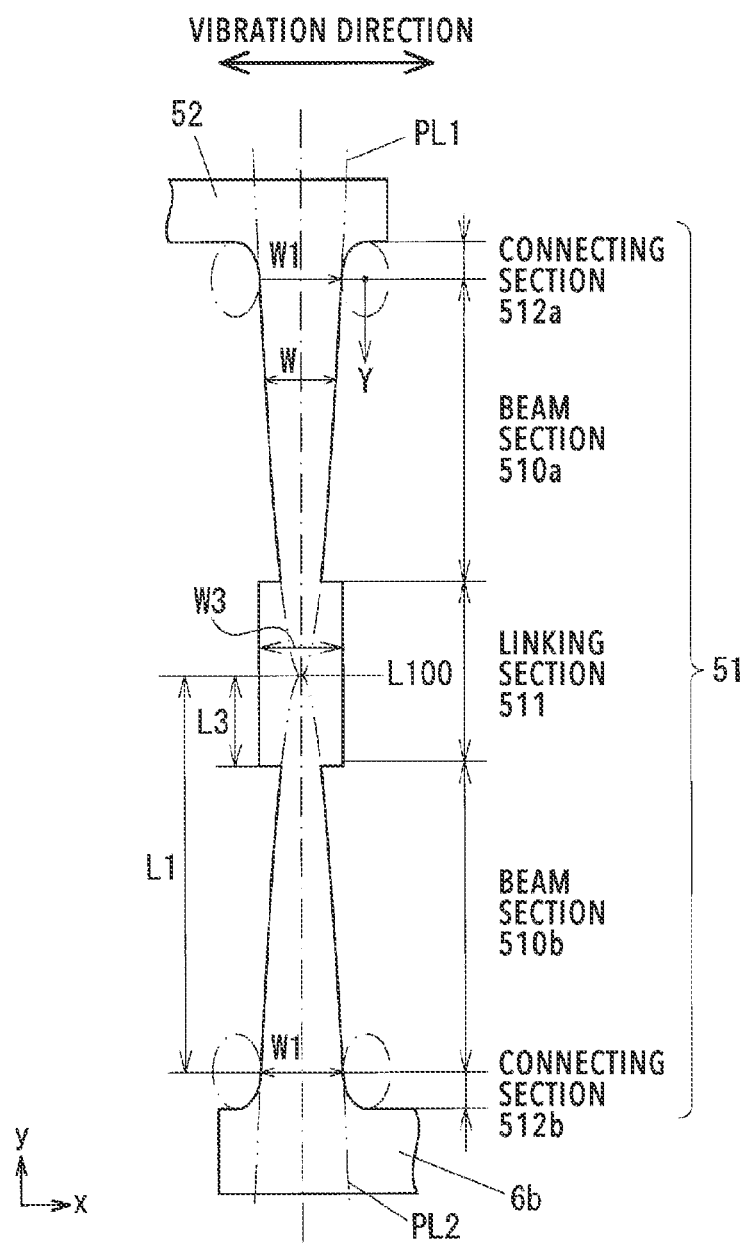
FIG. 2 is an enlarged view of a MEMS beam structure.

FIG. 2 is an enlarged view of one of the MEMS beam structures 51 provided on the elastic support section 5. The MEMS beam structure 51 includes two beam sections 510a and 510b, a linking section 511 that connects the beam section 510a to the beam section 510b, a connecting section 512a that connects the beam section 510a to the coupling section 52, and a connecting section 512b that connects the beam section 510b to the fixed section 6b. As to the beam sections 510a and 510b, in a case where the width dimension of the roots of the beam sections 510a and 510b is W1 and a distance measured from the roots toward the tips of the beam sections is Y, the width dimension W of the beam sections 510a and 510b in the distance Y is set as in the following Equation (1). α is a positive constant.

$$W=\sqrt{(W1^2-4Y/\alpha)} \quad (1)$$

The change in the width dimension W with respect to the distance Y in Equation (1) is the same as the change in a value 2x obtained by doubling an x coordinate of a parabola $y=\alpha \cdot x^2$. In the present specification, a beam having the beam sections 510a and 510b in which the width dimension W in a vibration direction (x direction) is set as in Equation (1) is referred to as a parabolic beam.

The width dimension W in the vibration direction (x direction) of the beam sections 510a and 510b shown in FIG. 2 is set as in Equation (1). The right and left sides of the beam section 510a are formed along a parabola PL1, and the right and left sides of the beam section 510b are formed along a parabola PL2. In the example shown in FIG. 2, the contours of the beam sections 510a and 510b are also set to have a parabolic shape, but it is not always necessary to set the contours to have the parabolic shape as long as the contours have the width dimension that satisfies Equation (1). In a case where the center of the linking section 511 is the origin of xy coordinates, the parabola PL1 is represented as $y=\alpha \cdot x^2$, and the parabola PL2 is represented as $y=-\alpha \cdot x^2$. The dimensions of the beam sections 510a and 510b in the y direction are set to be equal, and the tips of the convex portions of the parabolas PL1 and PL2 are arranged so as to coincide with each other at the origin of the xy coordinates. The positions of the tips of the parabolas PL1 and PL2 are located at the center of the linking section 511 in the y direction, and the shape of the MEMS beam structure 51 is symmetrical with respect to a line L100, parallel to an x axis, going through the central position of the linking section.

FIG. 3(a) schematically shows a situation in which the MEMS beam structure 51 is deformed by vibration of the movable electrode 4. FIG. 3(a) shows a case where the coupling section 52 is relatively displaced in a positive x direction with respect to the fixed section 6b. As shown in FIG. 2, the shape of a portion including the beam sections 510a and 510b and the linking section 511 is symmetrical with respect to the line L100, parallel to the x axis, going through the central position of the linking section. Therefore, the shape of the deformed MEMS beam structure 51 is point-symmetrical with respect to the center of the linking section as shown in FIG. 3(a).

Regarding the cantilever beam having the structure shown in FIG. 3(b) in which the MEMS beam structure 51 is divided in two, it is possible to estimate the characteristics of the MEMS beam structure 51 from the above-mentioned matter by considering the characteristics in a case where a load f is applied to a beam tip portion which is a free end. In the following, the cantilever beam structure shown in FIG. 3(b) will be referred to as a MEMS beam structure 51A, and a half-length linking section will be referred to as a linking section 511A. The MEMS beam structure 51A constitutes the parabolic beam. The shape of the elastically deformed beam at the time of displacement is point-symmetrical with respect to the central portion of the beam. This also applies to the rectangular beam having a constant width dimension as disclosed in PTL 1, and this can be estimated from the characteristics of the cantilever beam in which the rectangular beam is divided in two.

MEMS Beam Structure 51A

The characteristics of the MEMS beam structure 51A which is an elastic beam include a spring constant k and a maximum deflection Xmax. The spring constant k affects a load-deflection characteristic, the resonance frequency of the system, and the like. Further, in a case where the elastic beam is greatly bent, the stress of a part of the material increases, and eventually exceeds an allowable stress. The limit amount of deformation that does not exceed the allowable stress is the above-described maximum deflection Xmax. That is, if the elastic beams have the same spring constant k and the maximum deflection Xmax, it can be considered that these elastic beams are equal in performance as a spring. Therefore, a smaller elastic support section 5 can be obtained by reducing the size of the MEMS beam structure 51A while keeping the required values of the spring constant k and the maximum deflection Xmax.

As an example, a case where external vibration is a single frequency sine wave in the vibration-driven energy harvesting element 1 will be described. When the vibration-driven energy harvesting element 1 is brought into a resonance state by the external vibration to generate power, the upper limit of the generated power is represented by the following Equation (2) where Pmax is the upper limit of generated power, m is the mass of a movable section (the movable electrode 4 in this case), w is the angular frequency of the external vibration, X0 is the upper limit of the vibration amplitude of the movable section, B is the amplitude of the external vibration, and kx is a spring constant in the x direction.

$$P\mathrm{max}=(\tfrac{1}{2})m\omega^3 X0 \cdot B=(\tfrac{1}{2})kx \cdot X0 \cdot \omega \cdot B \quad (2)$$

In Equation (2), the angular frequency w and the amplitude B are given by external vibration conditions, and the spring constant kx is determined by the shape and material of the elastic beam. The upper limit of the vibration amplitude X0 is generally determined by the size of the vibration-driven energy harvesting element 1 and the lengths of the comb teeth 30 and 40, but needs to be smaller than the maximum deflection Xmax. The upper limit of generated power Pmax is the theoretical upper limit of output. However, since the energy conversion efficiency of "comb teeth"+"electret" is very high, it is known that the actual output power is about the same as Pmax. The output power is determined by kx·X0, and thus can be said to be determined by the spring constant kx and the maximum deflection Xmax of the MEMS beam structure 51A. That is, if the MEMS beam structures 51A have the same spring constant kx and the maximum deflection Xmax, the output power will be the same regardless of shape or size.

On the other hand, a device size is required to be as small as possible because the device size is related to the costs of materials and packages. Therefore, a condition required of the MEMS beam structure 51 is "a spring as small as possible having the characteristics of the spring constant kx and the maximum deflection Xmax."

Comparison Between Parabolic Beam and Rectangular Beam

Figure 3:
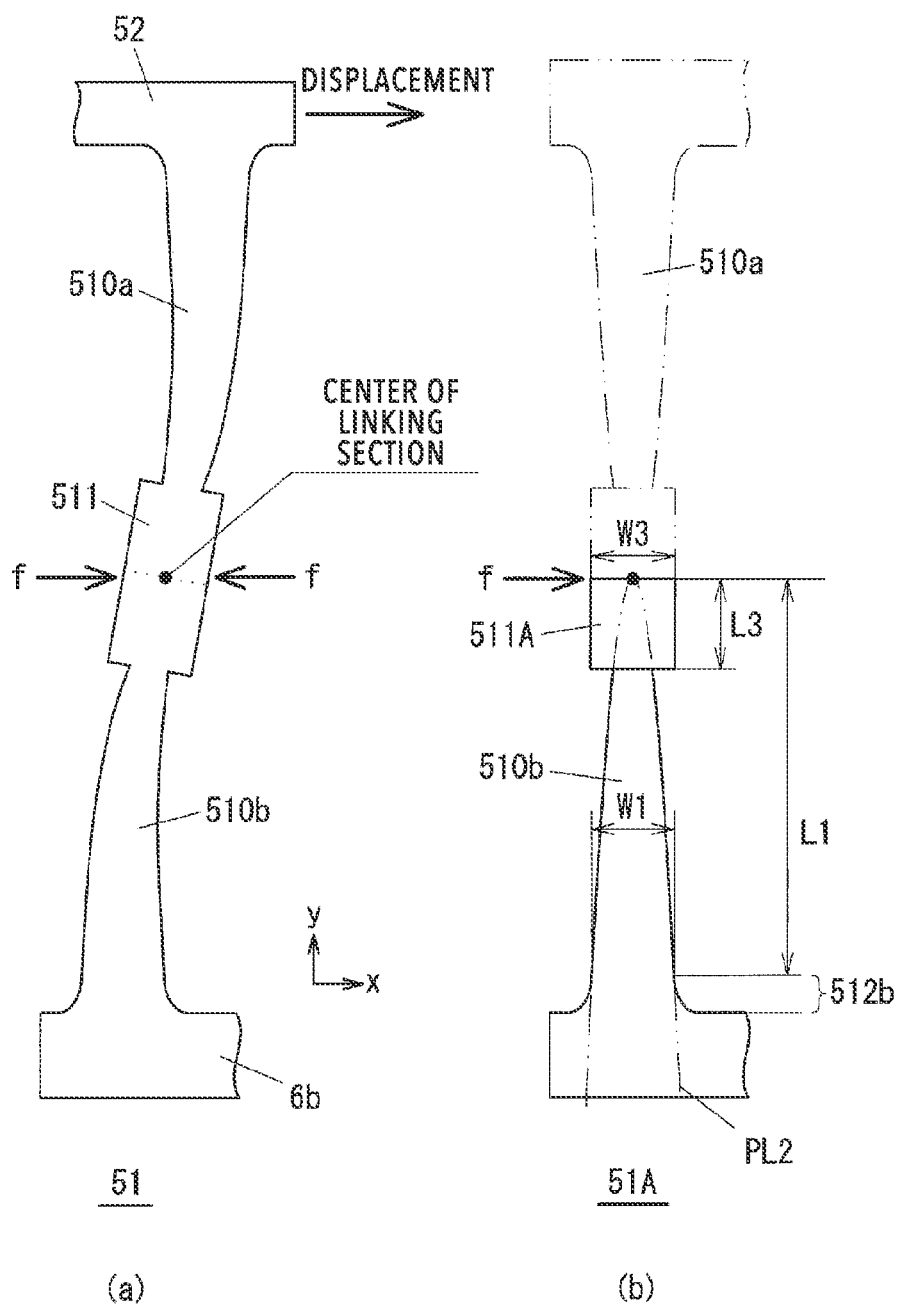
FIG. 3(*a*) is a diagram schematically showing a situation in which the MEMS beam structure is deformed, and FIG. 3(*b*) is a diagram showing the MEMS beam structure of a cantilever beam structure.
Figure 4:
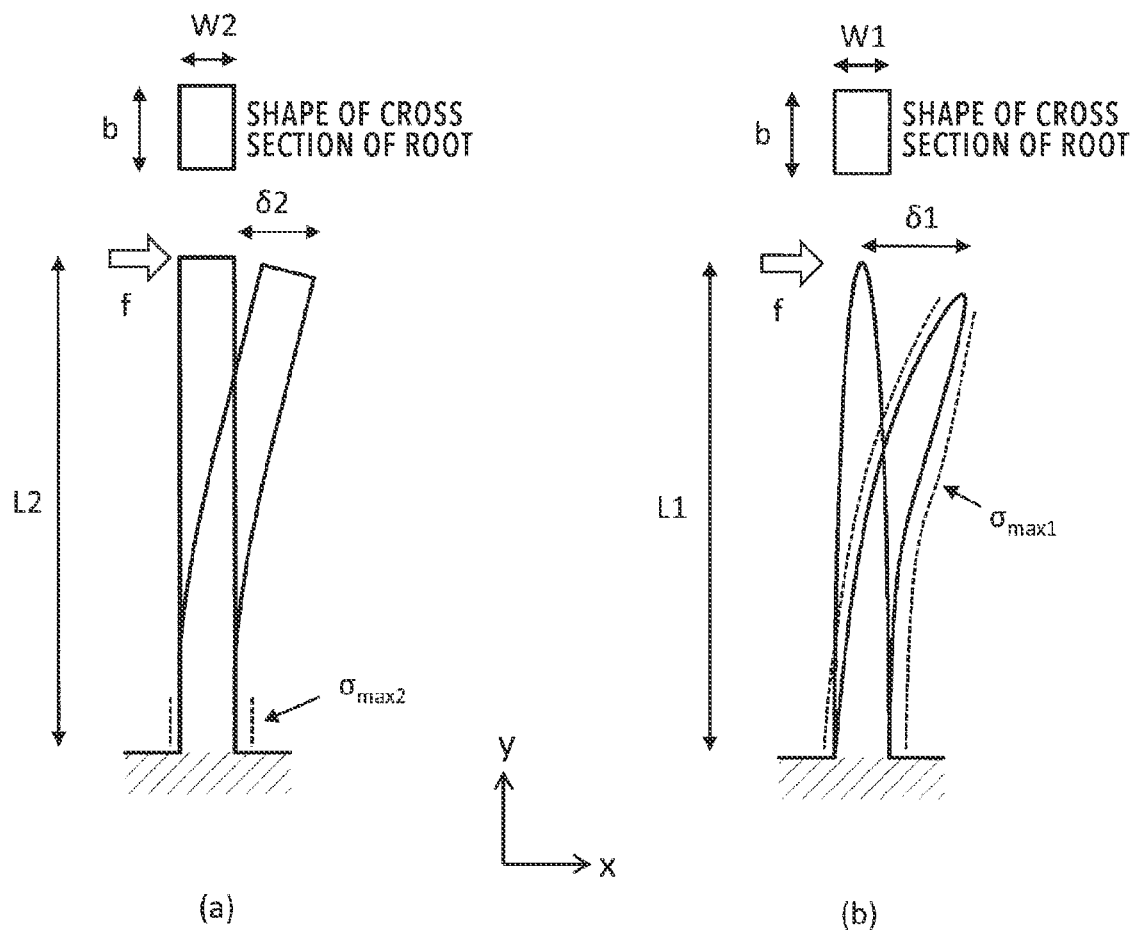
FIG. 4 is diagram showing a rectangular beam and a parabolic beam of the cantilever beam structure.

Regarding the cantilever beam shown in FIGS. 4(a) and 4(b), comparison will be hereinafter made between a conventional rectangular beam and the parabolic beam of the present embodiment by calculating the stress and the spring constant in a case where the load f is applied as shown in FIG. 3(b). FIG. 4(a) shows a model of the conventional rectangular beam, and FIG. 4(b) shows a model of the parabolic beam. As has been described with reference to FIG. 3, both the parabolic beam model and the rectangular beam model can be used by means of the cantilever beam models of FIGS. 4(a) and 4(b). Although in FIG. 3(b), the parabolic beam includes the linking section 511, which is not parabolic, an ideal parabolic beam that does not include the linking section 511 as shown in FIG. 4(b) is used as a model for the comparison here.

Rectangular Beam Model

First, the case of the conventional rectangular beam model shown in FIG. 4(a) will be described. The length of the beam is set to L2, the width dimension of a beam root in the x direction is set to W2, and a height dimension is set to b. There is a relation of the following Equation (3) between the load f applied to the tip (free end) of the rectangular beam and deflection δ2. E is Young's modulus.

$$\delta 2 = 4L2^3 \cdot f / EbW2^3 \qquad (3)$$

In the case of the rectangular beam, since a cross-sectional shape is constant from the tip to the root, deformation strain is the largest at the beam root where bending moment is the largest. Therefore, the absolute value of tensile stress is the largest on the surface of the beam root. The stress (maximum stress value) σmax2 at the beam root can be obtained by the following Equation (4).

$$\sigma \max 2 = (6f/b)(L2/W2^2) \qquad (4)$$
$$= (6f/b)(L2/W2)(1/W2)$$

The spring constant k2x in the x direction in a case where the load f is applied to the beam tip can be represented by the following Equation (5).

$$k2x = f/\delta 2 \qquad (5)$$
$$= (Eb/4)(W2/L2)^3$$

In order to reduce the size of the beam while keeping the spring constant k2x constant, W2 and L2 may be reduced while keeping the value of (W2/L2) constant. On the other hand, when W2 is reduced in such a manner, σmax2 increases in inverse proportion to W2 as shown in Equation (4). Further, W2 and L2 when σmax2 reaches the allowable stress are the minimum values of W2 and L2.

Parabolic Beam Model

The parabolic beam model of FIG. 4(b) will be described. The beam has an ideal parabolic shape and a length from the root to the tip is L1. The width dimension of the beam root in the x direction is W1, and a height dimension is b as in the rectangular beam. When the load f is applied to the tip (free end) of the parabolic beam, deflection δ1 at that time can be represented by the following Equation (6). In a case where the parabolic beam has the same size as that of the rectangular beam, that is, L1=L2 and W1=W2, the deflection δ1 of the parabolic beam is twice the value of the deflection δ2 of the rectangular beam.

$$\delta 1 = 8L1^3 \cdot f / EbW1^3 \qquad (6)$$

The parabolic beam has characteristics that as the bending moment increases, moment of inertia of area also increases in harmony and surface strain is equal all across the area. Therefore, the points where the absolute value of the tensile stress becomes maximum are uniformly distributed on the surface from the root to the tip and a maximum stress value δmax1 can be represented by the following Equation (7). Thus, a beam of this shape is referred to as a beam of uniform strength.

$$\delta \max 1 = (6f/b)(L1/W1^2) \qquad (7)$$

In the present embodiment, as shown in FIG. 2, the beams of uniform strength (beam sections 510a, 510b) are configured to be connected such that the vertices of the parabolas coincide with each other, whereby even a double-supported beam structure has characteristics similar to those of a cantilever beam of uniform strength. In a case where the size of the parabolic beam is the same size as that of the rectangular beam, that is, L1=L2 and W1=W2, the maximum stress value δmax1 of the parabolic beam calculated by Equation (7) is equal to a maximum stress value δmax2 in the case of the rectangular beam. A spring constant k1x in the x direction in a case where the load f is applied to the tip of the parabolic beam can be represented by the following Equation (8). Thus, if the size is the same size as that of the above-described rectangular beam, that is, L1=L2 and W1=W2, the spring constant k1x of the parabolic beam is half the value of the spring constant k2x of the rectangular beam.

$$k1x = f/\delta 1 \qquad (8)$$
$$= (Eb/8)(W1/L1)^3$$

Next, the case where the parabolic beam and the rectangular beam have the same spring constant will be described. That is, when k1x=k2x, the relation of the following Equation (9) holds between the dimensions L1, W1 and the dimensions L2, W2.

$$(L2/L1)^3 \cdot (W1/W2)^3 = 2 \qquad (9)$$

Also, assuming that the maximum stress values σmax1 and σmax2 are equal to each other when the same load f is applied, the relation of the following Equation (10) holds.

$$(L2/L1) \cdot (W1/W2)^2 = 1 \qquad (10)$$

Assuming that Equations (9) and (10) hold at the same time, the following Equations (11) and (12) can be obtained. Incidentally, a case where k1x=k2x and σmax1=σmax2 correspond to a case where the parabolic beam and the rectangular beam have the same maximum deflection Xmax.

$$L1/L2 = 2^{-(2/3)} \approx 0.63 \qquad (11)$$

$$W1/W2 = 2^{-(1/3)} \approx 0.79 \qquad (12)$$

As can be seen from Equations (11) and (12), the dimensions of the MEMS beam structure 51A in the y direction and in the x direction can be reduced by using the parabolic beam. Since it is necessary to provide a space for deformation in the x direction which is the deformation direction of the MEMS beam structure 51, the effect of size reduction of the elastic support section 5 including a plurality of MEMS beam structures 51 is small and a size reduction rate becomes larger than the value shown in Equation (12). Therefore, the size reduction of the elastic support section 5 is dominated by the size reduction in the y direction represented by Equation (11).

The size reduction rate shown in Equations (11) and (12) is a value when an ideal parabolic beam without the linking section 511 as shown in FIG. 4(b) is assumed. However, the linking section 511 that mechanically connects the tip portions of the two parabolic beams is actually essential, and the size reduction rate also needs to be slightly modified. As shown in FIG. 3(b), a spring constant k3x and a maximum stress value σmax3 when the load f is applied to the tip of the MEMS beam structure 51A, which is the cantilever beam including the linking section 511A, can be represented by the following Equations (13) and (14).

$$k3x = (Eb/8)(W1/L1)^3[1-(L3/L1)^{(3/2)}+(1/2)(W1/W3)^3(L3/L1)^3]^{-1} \quad (13)$$

$$\sigma max3 = (6f/b)(L1/W1^2) \quad (14)$$

Linking Section 511

First, focusing on the size reduction of the MEMS beam structure 51A in the y direction, the influence on the size reduction of the linking section 511A will be examined. Here, three patterns shown in FIGS. 5(a) to 5(c) will be compared with respect to the typical shapes of the linking section 511A. Assuming that the width dimension of the root of the beam section 510b is W1 and the dimensions of the linking section 511A in the x and y directions are W3 and L3, respectively, the pattern 1 of FIG. 5(a) is set so that W3/W1=2, the pattern 2 of FIG. 5(b) is set so that W3/W1=1, and the pattern 3 of FIG. 5(c) is set so that W3/W1=√(L3/L1).

Figure 6:
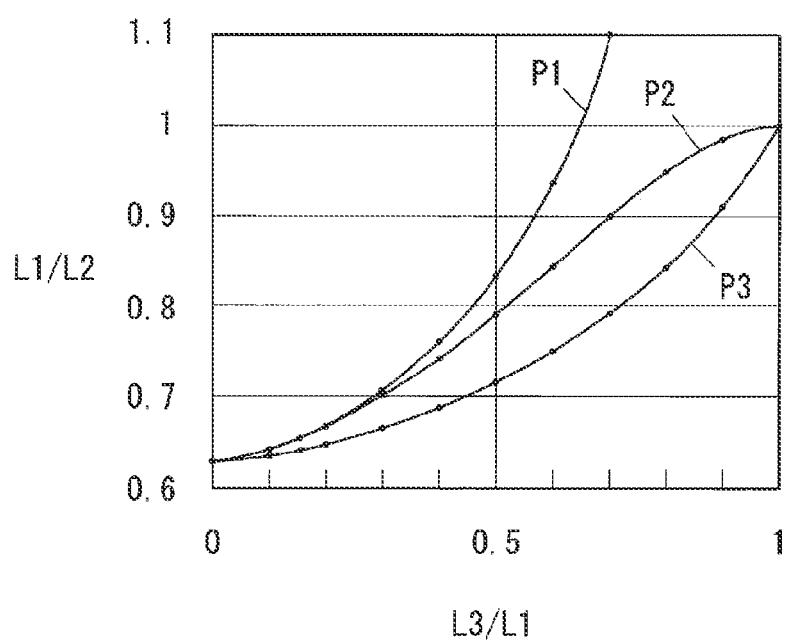
FIG. 6 is a diagram showing computation results related to Patterns 1 to 3.

FIG. 6 is a graph showing computation results, and shows how L1/L2, which represents the size reduction rate, changes with respect to the ratio L3/L1 of the dimension of the linking section 511A in they direction. Curves P1, P2, and P3 show the computation results of the patterns 1, 2, and 3, respectively. In any of the cases of the patterns 1 to 3, when L3/L1=0, the ideal parabolic beam without the linking section 511A is obtained and thus L1/L2 is 0.63 as described above. In the cases of the patterns 2 and 3, the beam shape when L3/L1=1 is the same as that of the rectangular beam having the width dimension W1 and thus L1/L2=1. On the other hand, in the case of the pattern 1, the beam shape when L3/L1=1 is a rectangular beam with a width dimension W3=2W1 and when L3/L1=1, L1/L2=4, which is not shown in FIG. 6.

From the viewpoint of size reduction, it can be seen that the shape of the pattern 3 is the best. With any of the shapes of the patterns 1 to 3, the size can be reduced to about 70% of that of the rectangular beam as long as L3/L1 is set to about 0.3. In the cases of the patterns 2 and 3, which have the width dimension W3 of the linking section 511A which is less than or equal to the width dimension W1 of the beam section 510b, the size can be reduced to 80% or less by setting L3/L1 to about 0.5.

Figure 7:
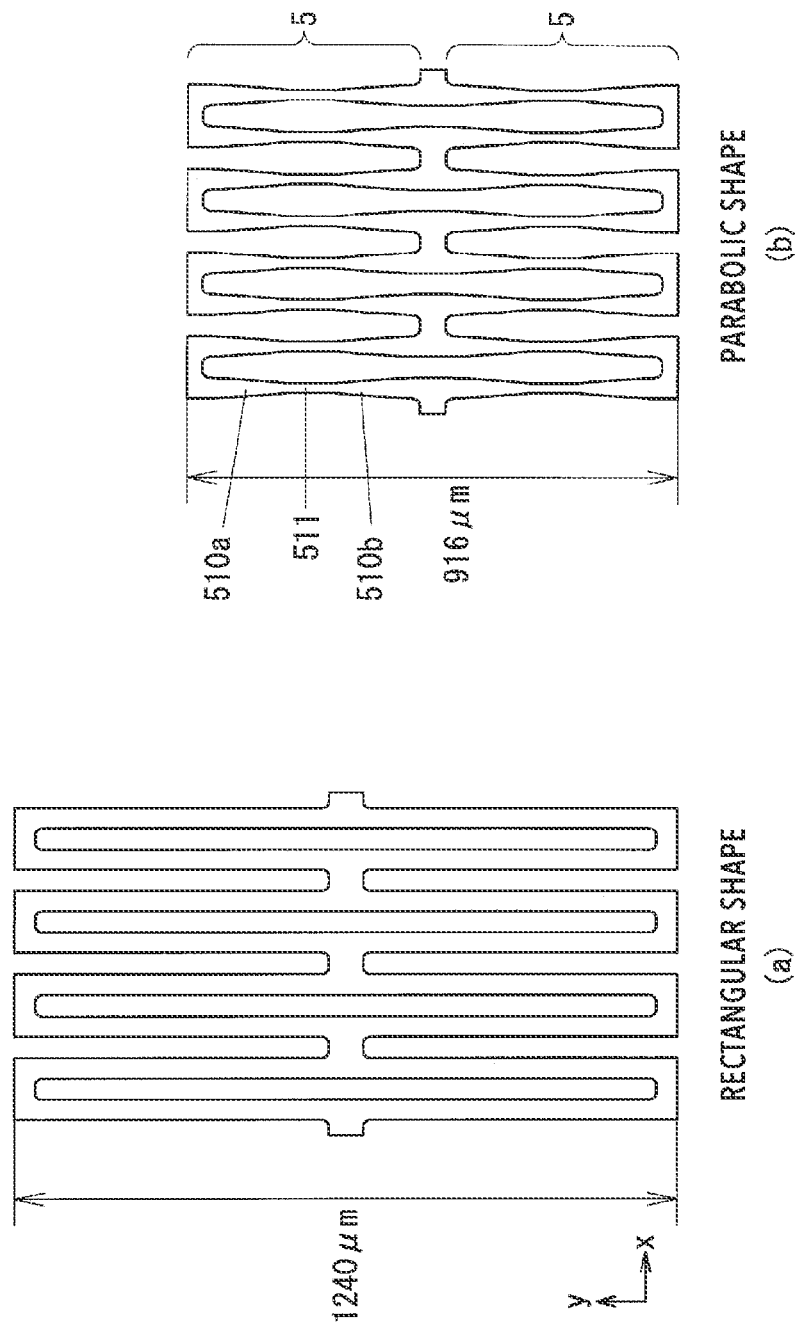
FIG. 7 is diagram showing elastic support sections in the case of using rectangular beams and elastic support sections in the case of using parabolic beams.

FIG. 7 is diagram showing an example of the size of the elastic support section 5 in the case of the rectangular beam and another example in a case where the shape of the MEMS beam structure 51A is the shape of the pattern 3. In FIG. 7, (a) shows the case of the rectangular beam, and (b) shows the case of the parabolic beam using the pattern 3. The configurations shown in FIG. 7 show configurations including a pair of upper and lower elastic support sections 5 on the right side or on the left side of FIG. 1. By using the parabolic beam, the dimension of the elastic support section 5 in the y direction is reduced to about 74%. In both cases of FIGS. 7(a) and 7(b), the stress near the beam root is the largest, but in the case of the parabolic beam, the stress is high almost uniformly on the entire surface of the beam sections 510a and 510b. On the other hand, in the case of the rectangular beam, the stress is concentrated near the beam root.

Incidentally, as to the elastic support section 5 that supports the movable electrode 4 that vibrates in the x direction as shown in FIG. 1, the characteristics related to the displacement in the x direction (spring constant k1x, maximum deflection Xmax) affect power generation characteristics. In such a configuration, the displacement of the movable electrode 4 in the y direction is an unnecessary displacement, and it is preferable that a spring constant k1y in the y direction be large enough not to cause the unnecessary displacement. When the MEMS beam structure 51 is not deformed as shown in FIG. 2, even if the width dimension W3 of the linking section 511 is small, the displacement in the y direction can be prevented to some extent. However, in the deformed state as shown in FIG. 3(a), the linking section 511 is tilted, and the magnitude of the tilt increases as the maximum deflection Xmax increases. In that case, if the width dimension W3 of the linking section 511 or the width dimension of connecting portions between the linking section 511 and the beam sections 510a, 510b is too small, there arises a problem that the spring constant k1y in the y direction becomes small and causes the unnecessary displacement.

Figure 5:
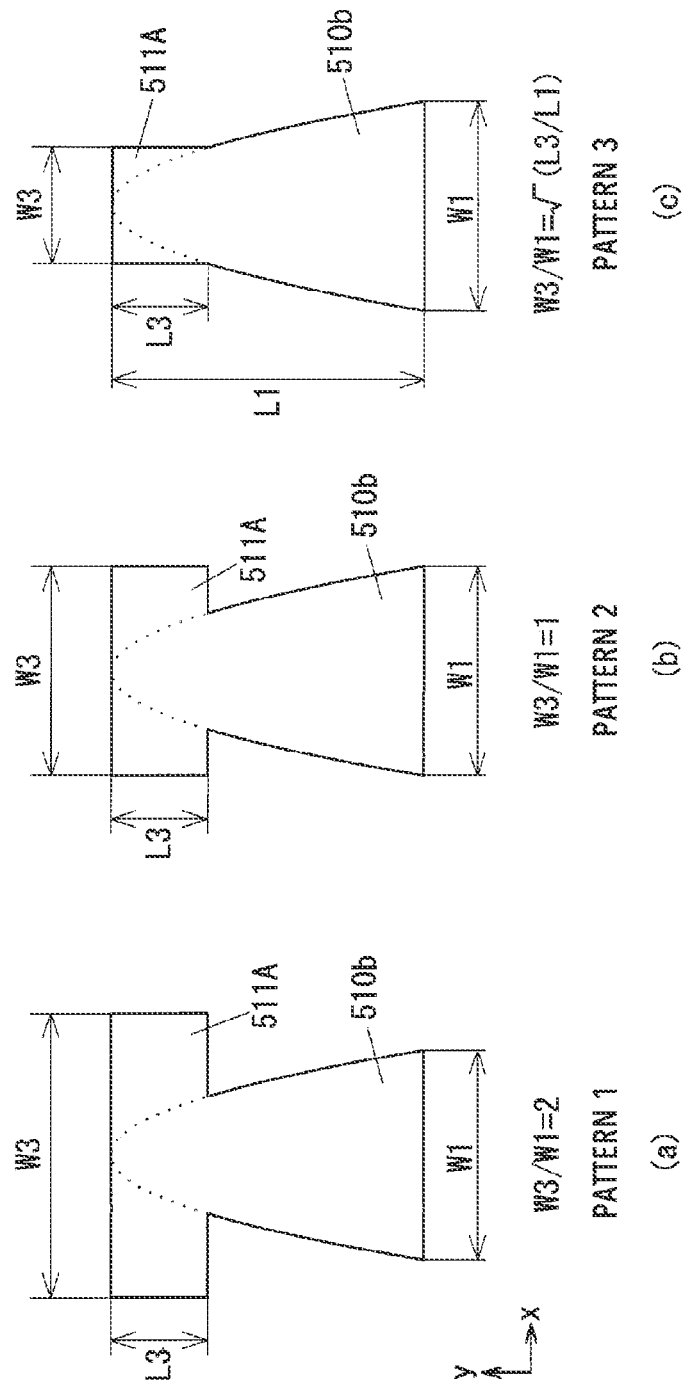
FIG. 5 is diagram showing three patterns of the MEMS beam structure.

For example, assuming that the standard for size reduction is 70%, in the cases of the patterns 1 and 2 shown in FIG. 5, L3/L1=0.3 and thus the width dimension of the portion where the beam section 510b is connected to the linking section 511A is √0.3·W1≈0.55W1. In the case of the pattern 3, since L3/L1 is about 0.5, the width dimension of the portion where the beam section 510b is connected to the linking section 511A is W3=√0.5·W1≈0.71W1. Therefore, the pattern 3 is preferable from the viewpoint of increasing the spring constant k1y in the y direction. That is, it is preferable that the length L3 of the linking section 511A be set so that L3=0.5L1 in the shape of the pattern 3.

Relation Between Parabolas PL1 and PL2

Figure 8:
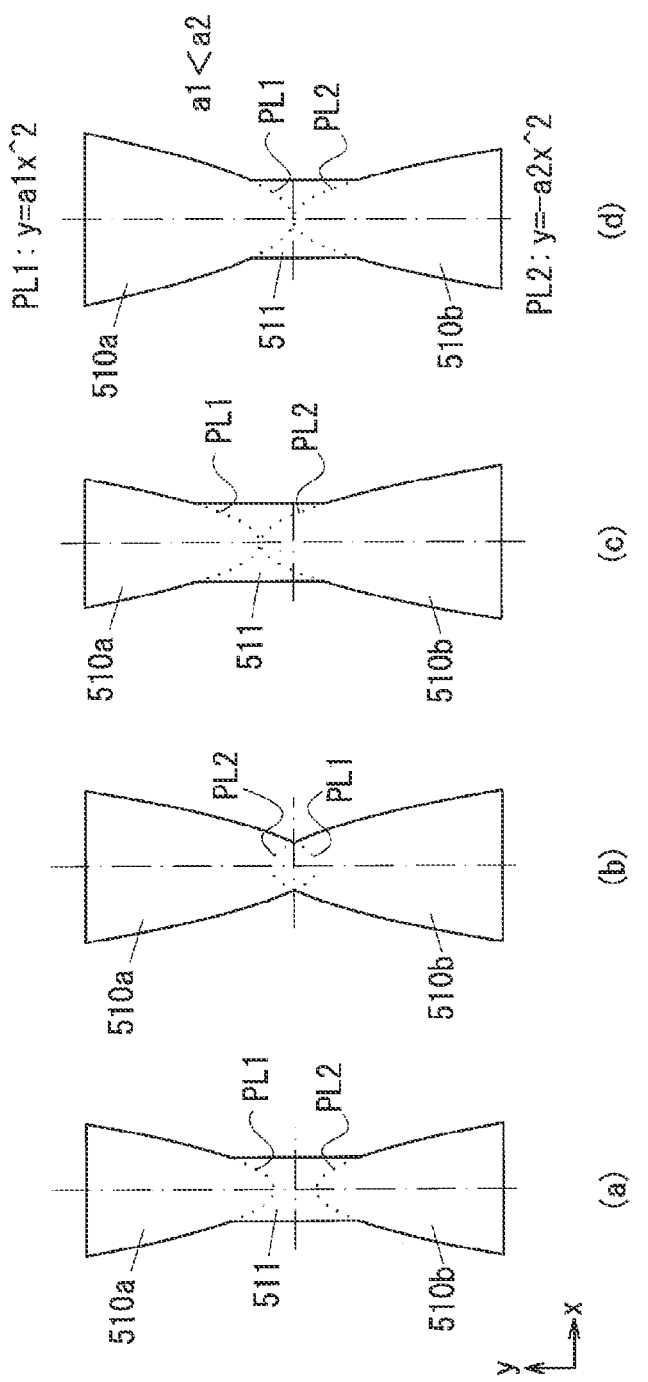
FIG. 8 is diagram showing various relations between parabolas PL1 and PL2.

In the descriptions with reference to FIGS. 2 to 7, the parabola PL1 with respect to the beam section 510a and the parabola PL2 with respect to the beam section 510b have the equal absolute value of a quadratic coefficient as shown in FIG. 2 and are set such that the vertices of the parabolas coincide with each other. FIG. 8 illustrate case where a relation between the parabolas PL1 and PL2 is different from the relation shown in FIG. 2. The conclusion is that the simulation result shows that the relation between the parabolas PL1 and PL2 shown in FIG. 2 is the most preferable, and in the cases of the shapes shown in FIG. 8, the uniformity of a stress distribution decreases, and as a result, the effect of size reduction decreases.

FIGS. 8(a) and 8(b) show the beam shapes in a case where the vertices of the parabola PL1 and the parabola PL2 do not coincide with each other. FIG. 8(a) shows a case where the vertices are apart and FIG. 8(b) shows a case where the vertices are inside the opposite parabolas. FIG. 8(c) shows a case where the coincidence point of the parabolas is displaced in a positive y direction, and as a result, the root width dimension is larger in the lower beam section 510b. FIG. 8(d) shows a case where the quadratic coefficients a1 and a2 of the parabolas are set so that a1<a2. In this case, since the upper beam section 510a has a smaller quadratic coefficient, the root width dimension is larger in the upper beam section 510a.

In order to make it possible to handle the beam as the free end as shown in FIG. 3(b) or 4(b), it is necessary for the MEMS beam structure 51 to deform into a symmetrical shape as shown in FIG. 3(a) so as to have a deformed shape identical to a shape in a case where the upper and lower beam sections singly deform. In the cases of the shapes of FIGS. 8(c) and 8(d), when the upper and lower beam sections 510a and 510b are considered as the free ends and an equal load is applied to each of the beam sections, angles at the free ends are different between the upper and lower beam sections. Therefore, a condition for the free end is not satisfied, the stress distribution becomes nonuniform, and the effect of size reduction decreases. Further, when the positions of the vertices of the parabolas PL1 and PL2 are displaced as shown in FIGS. 8(a) and 8(b), the relation between the bending moment and the width dimension at each beam section is broken from the "beam of uniform strength" and therefore a surface stress is not uniform. As a result, the effect of size reduction decreases.

In the MEMS beam structure 51 described above, as shown in FIG. 9(a), the two parabolic beams (beam sections 510a, 510b) are arranged such that the vertices of the parabolas PL1 and PL2 coincide with each other so as to satisfy the free end condition. By combining the two parabolic beams into a double-supported beam configuration in this manner, the bending moment becomes zero even at the time of deformation at a point A where the vertices coincide, and the beam sections can be regarded as the free ends as described above. As a result, the beam sections 510a and 510b, which are deformation sections, can have the same characteristics as those of the ideal parabolic beam.

Figure 9:
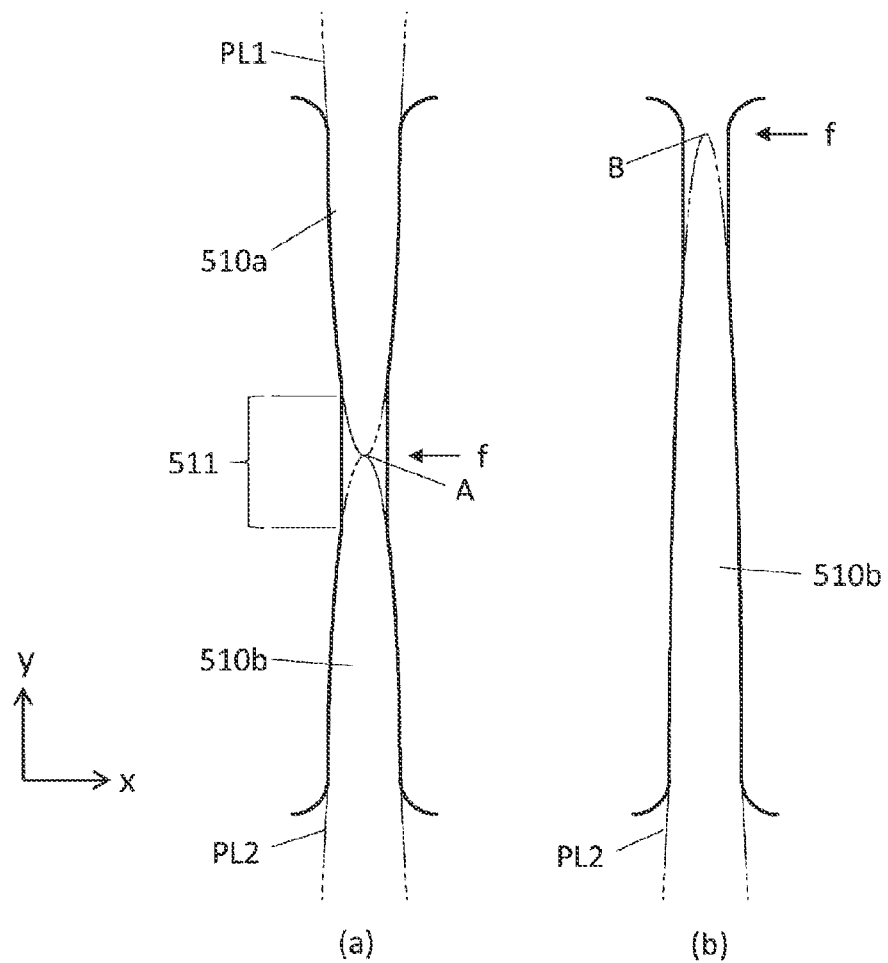
FIG. 9 is diagram showing the MEMS beam structure in the case of using two beam sections and the MEMS beam structure in the case of using one beam section.

On the other hand, in a case where a MEMS beam structure having the double-supported beam configuration is formed using one parabolic beam as shown in FIG. 9(b), the uniformity of the stress distribution cannot be obtained for the following reason.

That is, also in the case of the configuration of FIG. 9(b), the position of a vertex B of the parabola PL2 is surely a force point. However, since this configuration is the double-supported beam configuration, the deformation angle of a region including the vertex B is suppressed. Therefore, a condition is different from the condition for the free end, and it is difficult to obtain desired characteristics with this configuration.

Second Embodiment

In the first embodiment described above, the stress distribution is made uniform by using the parabolic beam as the beam sections 510a and 510b of the MEMS beam structure 51 to reduce the size of the elastic support section 5 mainly in the y direction. It is to be noted that in the MEMS beam structure 51 shown in FIG. 2, one end of the MEMS beam structure 51 is connected to the coupling section 52 and the other end is connected to the fixed section 6b, and at the connecting sections 512a and 512b of the MEMS beam structure 51, the strain at the time of deformation sharply changes from a finite magnitude to zero and the stress tends to become excessive locally.

Figure 10:
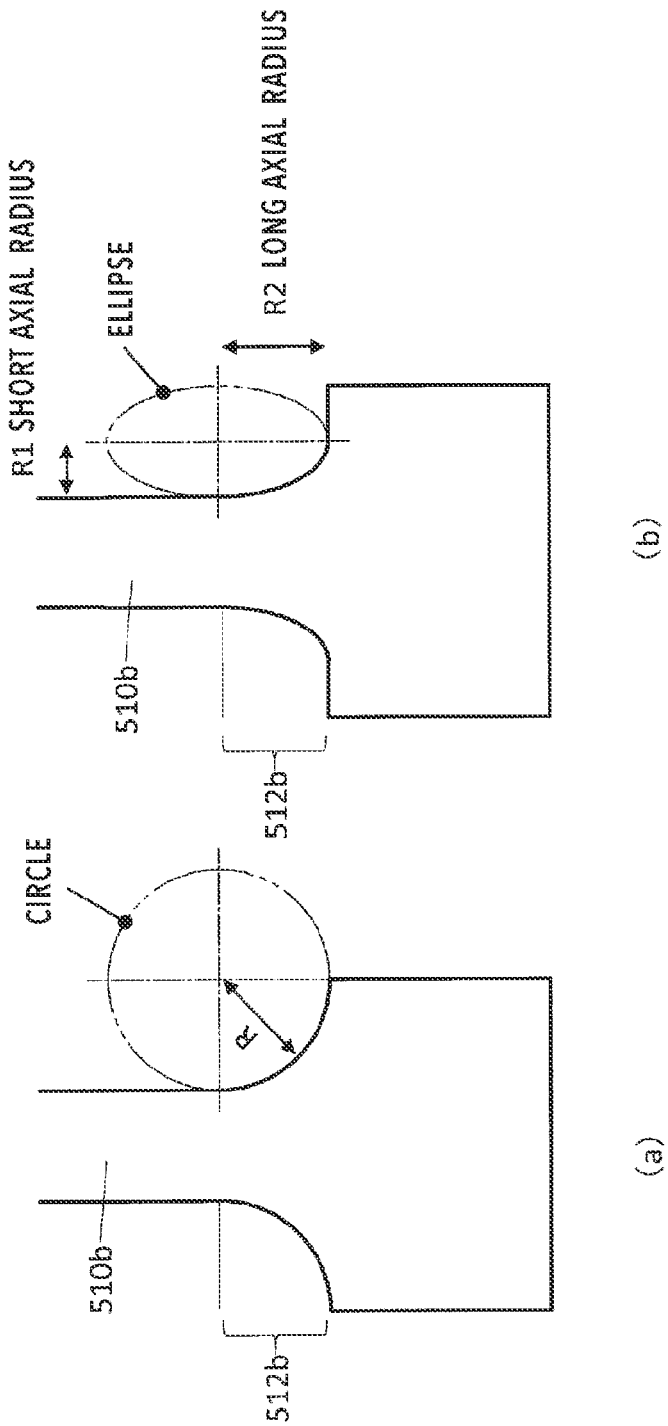
FIG. 10 is diagram showing an R chamfer and an elliptical chamfer.

In the first embodiment described above, the increase in stress is alleviated by performing R chamfering as shown in FIG. 10(a) on the connecting sections 512a and 512b. The larger the radius R of an R chamfer, the greater the effect, but if it is too large, it affects the device size. Therefore, in many cases, the radius R is set to a size approximately equal to the width dimension of the beam section 510b. Thus, in a second embodiment, the shape of a chamfer portion is changed from the circular shape of the R chamfer to the elliptical shape as shown in FIG. 10(b), whereby the stress increase is alleviated as compared with the case of the circular shape and it is possible to reduce the dimension of the elastic support section 5 in the x direction.

Figure 11:
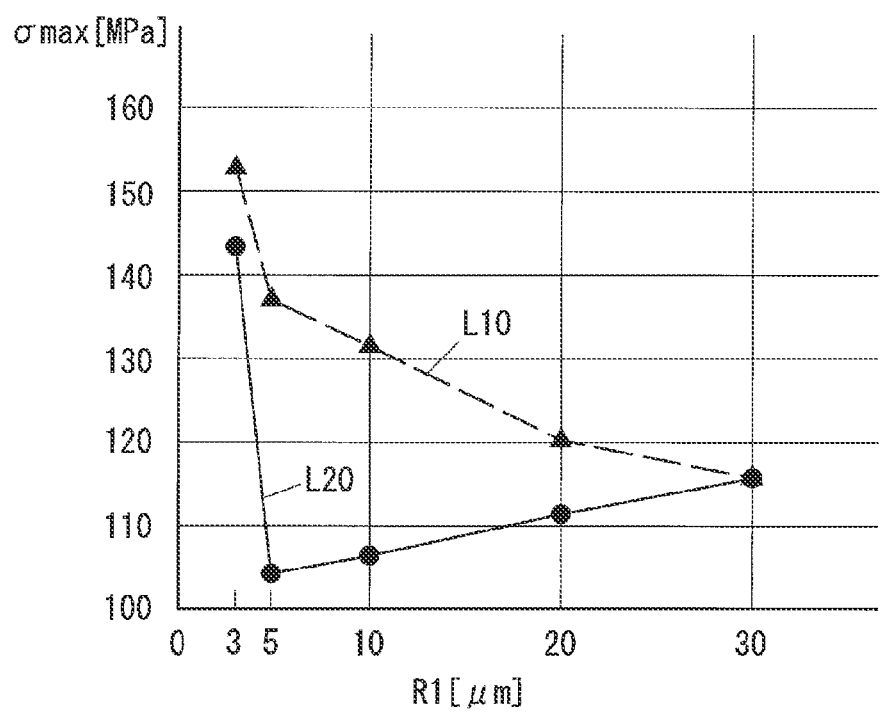
FIG. 11 is a diagram showing a second embodiment.

FIG. 11 shows a result of simulating how much a stress σmax rises due to the influence of the sharp change in shape from the root of the beam section 510b to the connecting section 512b. FIG. 11 shows, under the conditions of L1=500 μm, W1=30 μm, b=50 μm, and f=1.5 mN, the stress σmax (line L10) in a case where the radius R of a circular shape is changed and the stress σmax (line L20) in a case where a long axial radius R2 of an elliptical shape is fixed at R2=30 μm to change a short axial radius R1. Under the above-described conditions, the stress σmax at the beam section root calculated by Equation (7) related to the parabolic beam is 100 MPa, and an increased amount can be regarded as stress concentration due to the influence of the root shape.

In the case of R chamfering, when the radius R is increased from 5 μm to 30 μm, the stress σmax decreases as the radius R increases. The increased amount of the stress shows a decrease from 53.2 MPa to 15.6 MPa. As shown in FIG. 10(a), the curvature of a vicinity region near a contact point between the side surface of the beam section 510b and the R surface of the connecting section 512b at the connecting section 512b is smaller as the radius R is larger. Therefore, the rate of change in strain in the vicinity region is smaller as the radius R is larger, and the increase in stress σmax can be suppressed. However, as the radius R becomes larger, the size of the elastic support section 5 including the plurality of MEMS beam structures 51 in the y and x directions become larger, which hinders the size reduction of the elastic support section 5.

On the other hand, in the case of elliptical chamfering, if the long axial radius R2 is fixed at 30 μm and the short axial radius R1 is reduced from 30 μm, it can be seen that the stress σmax decreases as R1 becomes smaller, which is contrary to the case of R chamfering. The increase from the ideal stress shows that the stress σmax greatly decreases from 15.6 MPa when R1=30 μm to 3.9 MPa when R1=5 μm. In the case of elliptical chamfering, if the long axial radius R2 is kept constant to reduce the short axial radius R1, the curvature near the contact point of the connecting section 512b becomes smaller and this can be considered to have the effect locally equal to an effect produced by causing the radius R of the R chamfer to become larger.

In the case of the line L20 shown in FIG. 11, when a minimum value of 103.9 MPa is reached with R1=5 μm, and then R1 is further reduced, the stress σmax rises sharply. In other words, in elliptical chamfering, there exists a ratio R1/R2 at which the stress σmax is the lowest. The value of the ratio R1/R2 at which the stress σmax is the lowest depends on the width dimension W1 and the like of the beam section 510b, and the value is in the range of about 0.2 to 0.5.

That is, in the case of elliptical chamfering, it is possible to cause the stress σmax to be smaller than the stress σmax in the case of R chamfering with a radius R2 by setting R1 and R2 so that R1<R2. Further, in a case where the plurality of MEMS beam structures 51 are arranged in the x direction, the elliptical chamfering is performed so that R1<R2, which makes it possible to cause the spacing between the MEMS beam structures 51 to be smaller than that in the case of R chamfering with the radius R2. The effect of reducing stress concentration in the case of elliptical chamfering is produced not only on parabolic beams but also on rectangular beams and beams of other shapes.

The effects of the above-described embodiments can be summarized as follows.

(1) In the case of the MEMS beam structure 51 shown in FIG. 2, since the coupling section 52 is displaced in the x direction with respect to the fixed section 6b, the coupling section 52 is the movable section and is elastically supported by the MEMS beam structure 51. The MEMS beam structure 51 includes the beam section 510a and the beam section 510b extending in the y direction orthogonal to the x direction, and the linking section 511 that connects the tip of the beam section 510b to the tip of the beam section 510a that is connected to the coupling section 52. The beam sections 510a and 510b each have the shape as the beam of uniform strength, and the beam section root of the beam section 510a is displaced relatively in the x direction with respect to the beam section root of the beam section 510b according to the displacement of the coupling section 52 in the x direction.

As described above, the MEMS beam structure 51 has a configuration in which the tip of the beam section 510a, which is the beam of uniform strength, and the tip of the beam section 510b are connected by the linking section 511. When the beam section root of the beam section 510a is displaced relatively in the x direction with respect to the beam section root of the beam section 510b and then is deformed, the rise in stress of each section of the beam sections 510a and 510b can be made uniform. As a result, each section of the beam sections 510a and 510b, which are the deformation sections, can have elastic energy evenly and the MEMS beam structure 51 can be downsized as compared with the case where the rectangular beam as shown in FIG. 4(a) is used.

(2) Examples of the shapes of the beam of uniform strength include the parabolic beam as shown in FIG. 2. The width dimension X1 of the beam section 510a in the x direction is set so that $X1=\sqrt{(W1^2-Y1/A1)}$ when the dimension of the beam section root is W1, the distance from the beam section root is Y1, and A1 is the positive coefficient. The width dimension X2 of the beam section 510b in the x direction is set so that $X2=\sqrt{(W2^2-Y2/A2)}$ when the dimension of the beam section root is W2, the distance from the beam section root is Y2, and A2 is the positive coefficient.

(3) Furthermore, as in the beam sections 510a and 510b shown in FIG. 2, it is preferable that the dimensions of the beam section roots W1 and W2 be set to be equal, the coefficients A1 and A2 be set to be equal, and the beam sections 510a and 510b be set such that the value of the expression "$\sqrt{(W2^2-Y2/A2)}$" becomes zero at an intermediate position between the root of the beam section 510a and the root of the beam section 510b. By setting the beam sections 510a and 510b in this manner, each of the beam sections 510a and 510b exhibits the same characteristics as those in the case where the load f is applied to the free end of the cantilever parabolic beam as shown in FIG. 3(b), whereby the effect of the parabolic beam can be most exerted. This means that the parabolic beam has characteristics that as the bending moment increases, the moment of inertia of area also increases in harmony, and the surface strain becomes equal all across the area, and the point where the absolute value of tensile stress is maximized is evenly distributed all across the area of the beam sections 510a and 510b. As a result, the size of the MEMS beam structure 51 having the same characteristics as those of the conventional rectangular beam shape can be reduced.

Figure 12:
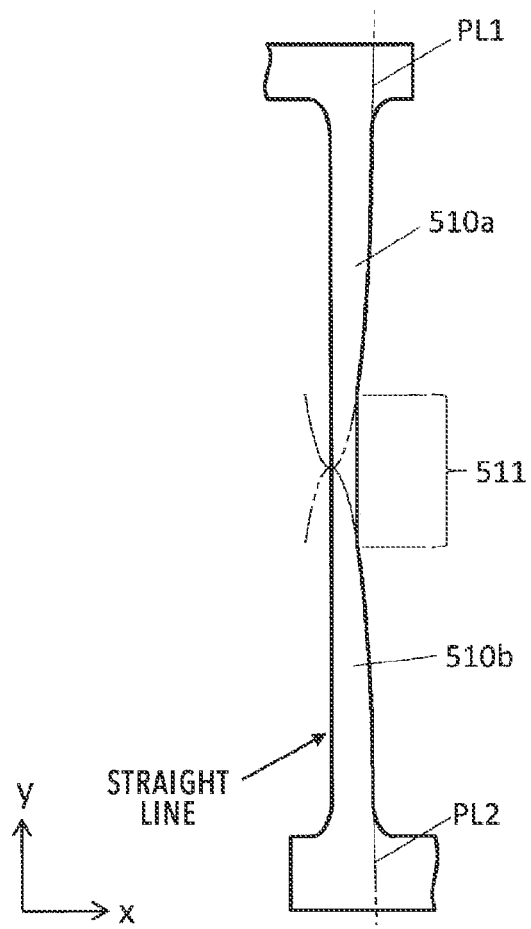
FIG. 12 is a diagram showing an example of deformation of the MEMS beam structure.

In the MEMS beam structure 51 shown in FIG. 2, although the contour shapes of both right and left sides of the beam sections 510a and 510b in the figure are parabolic, the contour shape of one side of the beam sections 510a and 510b may be linear as shown in FIG. 12. Also in this case, the width dimensions of the beam sections 510a and 510b change parabolically. In FIG. 12, the contour shape on the left side of the figure is linear.

(4) Further, as in the pattern 3 of FIG. 5(c), it is preferable that the width dimension W3 of the linking section 511A in the x direction be set to be equal to the width dimension of the beam section 510b at the connecting portion between the linking section 511A and the beam section 510b. By setting the width dimension W3 in this way, the size of the MEMS beam structure 51 can be smaller.

(5) As shown in FIG. 2, the connecting sections 512a and 512b for being connected to the coupling section 52 and the fixed section 6b, which are the connection targets, are provided, respectively at the roots of the beam sections 510a and 510b of the MEMS beam structure 51. It is preferable to form elliptical chamfers being continuous with the side surfaces of the roots of the beam sections 510a and 510b in the x direction at the side surfaces of the connecting sections 512a and 512b in the x direction. By forming the elliptical chamfer, the stress σmax at the connecting sections 512a and 512b can be made smaller than the stress σmax in the case of the R chamfer having the radius R2. It is possible to reduce the spacing between the plurality of MEMS beam structures 51 arranged in the x direction, that is, the size of the elastic support section 5 in the x direction.

In the above-described embodiments, the size of the vibration-driven energy harvesting element 1 is reduced by adopting the MEMS beam structure using the parabolic beam to the elastic support section 5 that supports the movable electrode 4 of the vibration-driven energy harvesting element 1. However, the MEMS beam structure using the parabolic beam can be applied not only to a vibration-driven energy harvesting element but also to a beam that supports a movable section such as an actuator or a sensor, and the same effect can be produced. For example, in a case where a movable section is fixed to a support frame via the MEMS beam structure such as an acceleration sensor, the root of the beam section 510a may be connected to the support frame which is one connection target, and the root of the beam section 510b may be connected to the movable section which is the other connection target.

Figure 13:
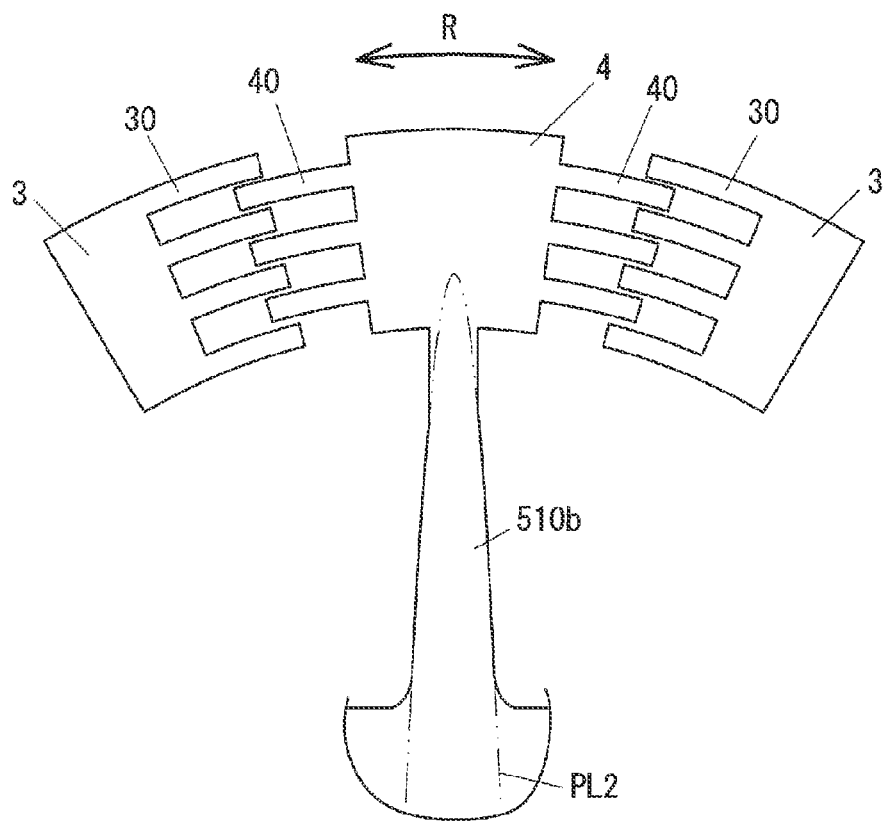
FIG. 13 is a diagram showing one example of the vibration-driven energy harvesting element having the MEMS beam structure of the cantilever beam structure.

Incidentally, in the above-described embodiments, the case where the two parabolic beams are combined to form the MEMS beam structure 51 having the double-supported beam structure has been described. However, it is also possible to use the MEMS beam structure having the cantilever beam structure as the elastic support section of the vibration-driven energy harvesting element as shown in FIG. 13. In the vibration-driven energy harvesting element 100 shown in FIG. 13, a movable electrode 4 having movable comb teeth 40 is provided at the tip of a beam portion 510b having a cantilever structure, and a pair of fixed electrodes 3 having fixed comb teeth 30 are provided with respect to the movable electrode 4. The shapes of the comb teeth 30 and 40 are arcuate, and the beam section 510b is deformed and the movable electrode 4 vibrates in an R direction, whereby the amount of engagement between the comb teeth 30 and 40 changes. As a result, power generation is performed.

Although the various embodiments and examples of deformation have been described above, the present invention is not limited to these. Other aspects conceivable within the scope of the technical idea of the present invention are also included within the scope of the present invention.

The disclosure of the following priority application that serves as the basis for the right of priority is herein incorporated as a reference.
Japanese Patent Application No. 2019-005388 (filed on Jan. 16, 2019)

REFERENCE SIGNS LIST

1 . . . vibration-driven energy harvesting element, 3 . . . fixed electrodes, 4 . . . movable electrode, 5 . . . elastic support sections, 6a, 6b . . . fixed sections, 30 . . . fixed comb teeth, 40 . . . movable comb teeth, 51, 51A . . . MEMS beam structures, 52 . . . coupling section, 510a, 510b . . . beam sections, 511, 511A . . . linking sections, and 512a, 512b . . . connecting sections

The invention claimed is:

1. A MEMS beam structure that elastically supports a movable section displaced in a first direction comprising:
a first beam section and a second beam section extending in a second direction orthogonal to the first direction; and
a linking section that connects a tip of the first beam section and a tip of the second beam section,
wherein the first beam section and the second beam section each have a shape with a width dimension in the first direction changing to a parabolic shape decreasing toward the tip as a beam of uniform strength, and
a beam section root of the second beam section is displaced relatively in the first direction with respect to a beam section root of the first beam section according to a displacement of the movable section in the first direction, wherein the beam section root of the second beam section is connected to the movable section.

2. The MEMS beam structure according to claim 1,
wherein a width dimension X1 of the first beam section in the first direction is set so that $X1=\sqrt{(W1^2-Y1/A1)}$ in a case where a beam section root dimension is W1, a distance from the beam section root is Y1, and A1 is a positive coefficient, and
a width dimension X2 of the second beam section in the first direction is set so that $X2=\sqrt{(W2^2-Y2/A2)}$ in a case where a beam section root dimension is W2, a distance from the beam section root is Y2, and A2 is a positive coefficient.

3. The MEMS beam structure according to claim 2,
wherein the beam section root dimensions W1 and W2 are set to be equal, the coefficients A1 and A2 are set to be equal, and
the first beam section and the second beam section are set such that a value of an expression "$\sqrt{(W2^2-Y2/A2)}$" becomes zero at an intermediate position between the beam section root of the first beam section and the beam section root of the second beam section.

4. The MEMS beam structure according to claim 3,
wherein a width dimension of the linking section in the first direction is set to be equal to the width dimensions of the first beam section and the second beam section in the first direction at connecting portions between the linking section and the first and second beam sections.

5. The MEMS beam structure according to claim 1,
wherein a connecting section that connects the MEMS beam structure to a connection target is provided at each beam section root of the first and second beam sections and
elliptical chamfers being continuous with side surfaces of the beam section roots in the first direction are formed at side surfaces of the connecting sections in the first direction.

6. A MEMS vibration-driven energy harvesting element comprising:
a fixed electrode, a movable electrode, and a support section that elastically supports the movable electrode,
wherein the support section has the MEMS beam structure that elastically supports a movable section displaced in a first direction comprising:
a first beam section and a second beam section extending in a second direction orthogonal to the first direction; and
a linking section that connects a tip of the first beam section and a tip of the second beam section,
wherein the first beam section and the second beam section each have a shape with a width dimension in the first direction changing to a parabolic shape decreasing toward the tip as a beam of uniform strength, and
a beam section root of the second beam section is displaced relatively in the first direction with respect to a beam section root of the first beam section according to a displacement of the movable section in the first direction, wherein the beam section root of the second beam section is connected to the movable section.

7. The MEMS beam structure according to claim 2,
wherein a connecting section that connects the MEMS beam structure to a connection target is provided at each beam section root of the first and second beam sections and
elliptical chamfers being continuous with side surfaces of the beam section roots in the first direction are formed at side surfaces of the connecting sections in the first direction.

8. The MEMS beam structure according to claim 3,
wherein a connecting section that connects the MEMS beam structure to a connection target is provided at each beam section root of the first and second beam sections and
elliptical chamfers being continuous with side surfaces of the beam section roots in the first direction are formed at side surfaces of the connecting sections in the first direction.

9. The MEMS beam structure according to claim 4,
wherein a connecting section that connects the MEMS beam structure to a connection target is provided at each beam section root of the first and second beam sections and
elliptical chamfers being continuous with side surfaces of the beam section roots in the first direction are formed at side surfaces of the connecting sections in the first direction.

* * * * *